United States Patent
Ruoff et al.

(10) Patent No.: US 9,535,332 B2
(45) Date of Patent: Jan. 3, 2017

(54) MASK FOR EUV LITHOGRAPHY, EUV LITHOGRAPHY SYSTEM AND METHOD FOR OPTIMISING THE IMAGING OF A MASK

(71) Applicant: CARL ZEISS SMT GmbH, Oberkochen (DE)

(72) Inventors: Johannes Ruoff, Aalen (DE); Daniel Kraehmer, Essingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 597 days.

(21) Appl. No.: 13/714,648

(22) Filed: Dec. 14, 2012

(65) Prior Publication Data

US 2013/0100428 A1 Apr. 25, 2013

Related U.S. Application Data

(63) Continuation of application No. PCT/EP2011/059669, filed on Jun. 10, 2011.

(60) Provisional application No. 61/354,925, filed on Jun. 15, 2010.

(51) Int. Cl.

| | |
|---|---|
| G03B 27/54 | (2006.01) |
| G03F 7/20 | (2006.01) |
| B82Y 10/00 | (2011.01) |
| B82Y 40/00 | (2011.01) |
| G03F 1/24 | (2012.01) |
| G03F 1/22 | (2012.01) |

(52) U.S. Cl.
CPC ........... *G03F 7/70141* (2013.01); *B82Y 10/00* (2013.01); *B82Y 40/00* (2013.01); *G03F 1/22* (2013.01); *G03F 1/24* (2013.01)

(58) Field of Classification Search
CPC .......... G03F 1/22; G03F 1/24; G03F 7/70141
USPC .................................................. 355/67; 430/5
See application file for complete search history.

(56) References Cited

U.S. PATENT DOCUMENTS

| | | |
|---|---|---|
| 6,015,640 A | 1/2000 | Cardinale |
| 2002/0115000 A1 | 8/2002 | Gupta et al. |
| 2004/0156029 A1 | 8/2004 | Hansen |

(Continued)

FOREIGN PATENT DOCUMENTS

| | | |
|---|---|---|
| EP | 1237041 A2 | 9/2002 |
| JP | 2002261005 A | 9/2002 |

(Continued)

OTHER PUBLICATIONS

J. Ruoff "Impact of mask topography and multilayer stack on high NA imaging of EUV masks", Sep. 2010.

(Continued)

*Primary Examiner* — Peter B Kim

(74) *Attorney, Agent, or Firm* — Edell, Shapiro & Finnan, LLC

(57) ABSTRACT

A mask (105) for EUV lithography includes a substrate (107), a multi-layer coating (108) applied to the substrate (107) and a mask structure (109) which is applied to the multi-layer coating (108) and which has an absorber material, the mask structure (109) having a maximum thickness of less than 100 nm, preferably not exceeding a maximum thickness of 30 nm, particularly preferably 20 nm, in particular 10 nm. Also disclosed is an EUV lithography system having such a mask (105) and a method for optimizing the imaging of such a mask (105).

30 Claims, 5 Drawing Sheets

(56) References Cited

U.S. PATENT DOCUMENTS

| | | |
|---|---|---|
| 2005/0088760 A1 | 4/2005 | Mann et al. |
| 2006/0095208 A1 | 5/2006 | Hirscher et al. |
| 2006/0141370 A1 | 6/2006 | Kim et al. |
| 2007/0082272 A1 | 4/2007 | Mann et al. |
| 2007/0224523 A1 | 9/2007 | Huh et al. |
| 2007/0248127 A1* | 10/2007 | Shiraishi ............... G02B 7/008 372/36 |
| 2008/0170310 A1 | 7/2008 | Mann |
| 2008/0182183 A1 | 7/2008 | Hayashi et al. |
| 2009/0148781 A1* | 6/2009 | Kamo et al. ................. 430/5 |
| 2009/0213345 A1* | 8/2009 | Mann ................ G03F 7/70075 355/53 |
| 2011/0228245 A1* | 9/2011 | Mann ............................ 355/67 |

FOREIGN PATENT DOCUMENTS

| | | | |
|---|---|---|---|
| JP | 2002329649 A | | 11/2002 |
| JP | 2006128705 A | | 5/2006 |
| JP | 2007515770 A | | 6/2007 |
| JP | 2007273656 A | * | 10/2007 |
| KR | 100735531 B1 | | 6/2007 |
| TW | 200847236 A | | 12/2008 |
| TW | I310485 B | | 6/2009 |
| WO | 2006105460 A2 | | 10/2006 |

OTHER PUBLICATIONS

J. Ruoff "Polarization-induced astigmatism caused by topographic masks", SPIE 6730, Photomask Technology, Oct. 30, 2007.

English language translation of Office Action dated Feb. 27, 2014, and of Search Report dated Feb. 13, 2014, from corresponding Chinese Application No. 201180029828.4.

English language translation of Office Action dated Jul. 8, 2014, from corresponding Japanese Application No. 2013-514654.

Mizuno Y. et al., "Illumination optics for source-mask optimization", Proc. SPIE 7640, Optical Microlithography XXIII, 764011, Mar. 10, 2010, doi:10.1117/12.846476.

Erdmann A. et al., "Mask diffraction analysis and optimization for EUV masks", Proc. SPIE 7271, Alternative Lithographic Technologies, 72711E, Mar. 18, 2009, doi:10.1117/12.814119.

Schellenberg F., "Resolution enhancement technology: the past, the present, and extensions for the future", Proc. SPIE 5377, Optical Microlithography XVII, 1, May 28, 2004, doi:10.1117/12.548923.

English language translation of Office Action in corresponding Chinese Application No. 201180029828.4, dated Apr. 17, 2015.

English language translation of Office Action in corresponding Taiwanese Application No. 100120847, dated Feb. 10, 2015.

Kim. E. J., et al., EUV lithography simulation for the 32nm node. Proc. SPIE 6151, Emerging Lithographic Technologies X, 61510V, Mar. 23, 2006.

Yulin. S., et al., EUV/soft x-ray multilayer optics. Proc. SPIE 5645, Advanced Microlithography Technologies, 289, Feb. 28, 2005.

Singer et al., "Handbook of Optical Systems," vol. 2: Physcial Image Formation Optical Systems. 1. Edition, Jul. 2005, "Zernike Polynomials" (retrieved on Aug. 25, 2015 from http://www.jcmwave.com/JCMsuite/doc/htmlParameterReference/0c19949d2f03c5a96890075a6695b258.html).

Office Action in corresponding Korean Application No. 1020137000975, dated Jun. 13, 2016, along with an English translation.

* cited by examiner

MASK FOR EUV LITHOGRAPHY, EUV LITHOGRAPHY SYSTEM AND METHOD FOR OPTIMISING THE IMAGING OF A MASK

REFERENCE TO RELATED APPLICATIONS

This is a Continuation of International Application PCT/EP2011/059669, with an international filing date of Jun. 10, 2011, which was published under PCT Article 21(2) in English, and which claims the priority of U.S. Provisional Application No. 61/354,925, filed Jun. 15, 2010. The disclosures of both these parent applications are incorporated into the present Continuation in their entireties by reference.

FIELD OF AND BACKGROUND OF THE INVENTION

The invention relates to a mask for EUV lithography, an EUV lithography system having such a mask and a method for optimising the imaging of a mask in an EUV lithography system.

Projection exposure systems for microlithography, referred to briefly as lithography systems below, generally comprise a light source, an illumination system which processes the light beams emitted by the light source to form illumination light, an object to be projected which is generally referred to as a reticle or mask, a projection objective which images an object field onto an image field and another object, on which the image is projected and which is generally referred to as the wafer or substrate. The mask or at least a portion of the mask is in the object field and the wafer or at least a portion of the wafer is in the image field of the projection objective.

If the mask is completely in the range of the object field and the wafer is illuminated without relative movement of the wafer and image field, the lithography system is generally referred to as a wafer stepper. If only a portion of the mask is in the region of the object field and the wafer is illuminated during relative movement of the wafer and image field, the lithography system is generally referred to as a wafer scanner. The spatial dimension defined by the relative movement of the reticle and wafer is generally referred to as the scanning direction.

The integration density of a lithography system that can ultimately be achieved on the wafer is substantially dependent on the following parameters: (a) depth of focus (DOF) of the objective lens, (b) image-side numerical aperture (NA) and (c) wavelength of the illumination light. For reliable operation of a lithography system, it is necessary to ensure a so-called process aperture which is as large as possible and which comprises possible focus variation (FV) and variation of the amount of illumination light for a desired critical dimension (CD), that is to say, the smallest structural width occurring on the wafer, and a given numerical aperture (NA). In order to further reduce the CD, the development in EUV lithography systems is generally towards increasing numerical apertures NA. In the following description, the term "critical dimension" does not refer to the minimum structural width but will instead be used as a synonym for the line width or the structural width.

Periodic structures are decisively important for the integration density of the integrated switching circuit which is intended to be produced by means of the microlithographic illumination process. They are described by the pitch, that is to say, period length, and structural width. The structural width used on the wafer can be freely adjusted up to a given degree by the lacquer threshold of the resist to be illuminated. However, the smallest achievable pitch $\text{Pitch}_{min}$ is given by the wavelength $\lambda$ of the illumination light and the object-side numerical aperture NA of the objective lens. The following applies:

$$\text{Pitch}_{min} \sim \lambda(NA(1+\sigma))$$

to coherent and incoherent illumination with a predetermined $\sigma$ setting.

Currently, the best resolutions of pitch and CD are operated by so-called EUV lithography systems having a source of weak X-radiation (referred to as EUV/extreme ultraviolet in technical jargon) at a wavelength of the illumination light of approximately 13.5 nm. These are also referred to as EUV systems in technical jargon. The associated objective lenses which image the illuminated mask onto the wafer are catoptric objective lenses. These are typically operated with image-side numerical apertures of from 0.2 to 0.35 or above. Reference may be made to, for example, US2005 0088760A1 or US2008 0170310A1.

The mask to be imaged generally has a glass substrate, such as ULE™ or Zerodur®, which becomes highly reflective with light having a wavelength of 13.5 nm owing to a stack of dielectric layers, in particular alternating Mo and Si layers, and the mask structure which is in the form of a structured absorber layer on the layer stack is again defined by a structured chromium layer or by a structured layer of tantalum nitride (TaN) or other materials. The thickness of the structured absorber layer or the mask structure is typically more than 100 nm.

The structures on the mask to be imaged generally have two preferred directions. When the imaging qualities of a projection illumination system are assessed, therefore, a distinction is drawn at least between the maximum resolvable pitch of H (horizontal) and V (vertical) structures. In this instance, it should be hereinafter agreed that an H structure is intended to refer to a sequence of light-permeable and non-light-permeable regions of the mask structure, each individual region of those regions having its greater extent so as to be orthogonal relative to the scanning direction.

The illumination of the mask takes place with reflection in EUV lithography systems. Therefore, it is not possible to have telecentric illumination of the mask in non-obscured systems because otherwise the illumination system and the objective lens would be in the way. The chief ray angle (synonym: chief ray angle (CRA)) is the angle of the main beam of the illumination light relative to a notional orthogonal with respect to the object plane of the objective lens. In a projection exposure system as set out in US2005 0088760A1, a CRA of 6° is used with an image-side numerical aperture NA of 0.33. In a projection exposure system as set out in US2008 0170310A1, a CRA of 15° is used with an image-side numerical aperture NA of 0.5. Generally, the CRA used increases with the numerical aperture NA of the objective lens.

As set out in greater detail below, the CRA which is different from 0° results in shadows of the reflected illumination light owing to the extent of the mask structures orthogonally relative to the object plane of the objective lens. In this instance, this is a purely topographical effect of the mask which is determined by the geometric, three-dimensional arrangement of the illumination system, mask and objective lens. This is no longer negligible for EUV lithography systems particularly with a high NA and therefore a high CRA because the thickness of the structured layer (mask structure) is generally several wavelengths of the illumination light of 13.5 nm, and reference can consequently be made to shadowing of the mask structure.

Simple geometric observation makes it apparent that this shadowing appears more intensely for H structures than for V structures if it is assumed for the design of the illumination system and the objective lens that the incidence plane of the CRA on the mask is orthogonal to the extent of an individual structure of the H structures. The size of the difference of the structural widths of H and V structures on the wafer with the structural widths on the mask being assumed to be identical depends on the position thereof as an object point when viewed in the object plane of the objective lens, more specifically the azimuth angle at which the object point is orientated relative to an axis of a coordinate system which is in the object plane, which axis extends in the scanning direction. Since the CRA is measured in a plane perpendicularly relative to the object plane in which the axis of the coordinate system is located, the CRA appears to be rotated for object points which are not located on that axis, that is to say, which have an azimuth angle different from 0°.

H structures are generally imaged so as to be wider in dependence of their position in the object plane of the objective lens. There is further produced for H structures a displacement of the image which is dependent on the focal position of the mask and which corresponds to a field-dependent redirection of the wave front $Z2$, $Z3$ which can be corrected by correcting the focal position of the mask. The coefficients $Z2$, $Z3$ are Zernike coefficients whose indexing follows Fringe notation, cf. "Handbook of Optical Systems, Singer et al. (eds.), WileyVch, 2005". If the entire wave front is analysed, field-dependent distortion terms $Z2$, $Z3$, focus variations $Z4$ and astigmatism $Z5$, $Z6$ result as aberrations. These are accompanied by wave front errors of higher orders, such as comas $Z7$, $Z8$ and secondary astigmatism $Z12$, $Z13$.

The explanation for the occurrence of those imaging errors which are also referred to below as "rigorous effects" is explained in greater detail, for example, in the article by J. Ruoff: "Impact of mask topography and multi-layer stack on high NA imaging of EUV masks", Proc. SPIE 7823, September 2010. Rigorous effects are considered in the above-mentioned article. The rigorous effects depend on the structural widths, the material which defines the structures of the mask such as, for example, Cr, and the thickness of those structures in the direction of the beam path of the illumination light in the region of the mask.

In addition to the imaging errors which are produced owing to the shadowing or the rigorous effects of the mask structure and which become perceptible in particular in the form of a telecentricity error, the fact that the multi-layer coating has a reflectivity which varies over the incidence angle range of the radiation which strikes the mask also results in a variation of apodisation in the objective pupil which also results in a telecentricity error during imaging. However, those two contributions to the telecentricity error cannot be optimised separately from each other owing to the non-linearity of the rigorous effects to be considered.

In lithography systems, particularly in EUV lithography systems, there is a need for correcting the structural width and pitch-dependent aberrations of the wave front which are induced by the rigorous effects of the mask, and there is a particular need to correct the structural width and pitch-dependent astigmatism which is induced by the mask, the structural width and pitch-dependent distortion which is dependent on the position of the object point and the structural width and pitch-dependent focal position.

OBJECTS AND SUMMARY OF THE INVENTION

An object of the invention is to provide a mask for EUV lithography, an EUV lithography system especially for high numerical apertures and a method which allow the mask to be imaged with greater quality.

This object is achieved according to one aspect by a mask for EUV lithography comprising: a substrate, a multi-layer coating applied to the substrate and a mask structure which is applied to the multi-layer coating and which has an absorber material, the mask structure having a maximum thickness of less than 100 nm and preferably not exceeding a maximum thickness of 30 nm, particularly preferably 20 nm, in particular 10 nm. In this instance, the mask structure typically comprises one or more structured layers of the absorber material and is also referred to below as the absorber layer.

By the thickness of the mask structure or the absorber material being limited to a thickness of less than 100 nm, in particular 30 nm or less, the shadowing of the mask structure and the associated negative effects on the imaging quality can be greatly reduced. This is particularly advantageous if a large numerical aperture and accordingly a large CRA are used to illuminate the mask.

In one embodiment, the multi-layer coating for improving the imaging of the mask in an EUV lithography system has an optical design which is dependent on the mask structure and which varies in dependence of the position. The term optical design of the multi-layer coating is intended to be understood to be the layer design of the multi-layer coating, that is to say, both the selection of the coating materials, and therefore the refraction indexes of the individual layers, and the thickness of the layers and the sequence thereof. In this instance, it is proposed to adapt the optical design of the multi-layer coating to the mask structure, more precisely to the absorber structures which are provided locally on the mask, so that the local optical design of the multi-layer coating is dependent on the mask structure which is applied to the multi-layer coating. It is thereby possible to improve or optimise the imaging of the mask in an EUV lithography system and in particular to reduce imaging errors. This is comparable to mask imaging optimisation which is known under the name OPC (optical proximity correction) or RET (resolution enhancement techniques) and in which the mask structures used are adapted in terms of their geometry so that the desired image of the mask is produced when the mask structures are imaged by a projection system.

In this instance, the optical design can be adapted by the thicknesses of individual layers of the multi-layer coating, for example, layers of silicon or molybdenum, being varied independently of each other in dependence of the position on the mask (see, e.g., positionally dependent thickness $D_{Si}(X, Y)$ of a silicon layer and positionally dependent thickness $D_{Mo}(X,Y)$ of a molybdenum layer of FIG. 3a). In this instance, the thickness of the multi-layer coating will generally vary but this is not necessarily the case because, for example, the silicon layers can be scaled by a first factor and the molybdenum layers can be scaled by a second reciprocal factor so that the total thickness of the multi-layer coating remains constant.

In a development, the optical design of the multi-layer coating which varies in dependence on position comprises a positionally-dependent change in the thickness of the multilayer coating. In this instance, in the simplest case, all the layers of the multi-layer coating which have an influence on the reflectivity of the coating can be scaled by a common factor so that the total thickness of the multi-layer coating is scaled by the same factor in dependence on position. Typically, a plurality of double-layers comprising silicon and molybdenum influence the reflectivity of the multi-layer coating so that they, or optionally only some of those double layers, are scaled by a common factor in the simplest case. It will be appreciated that other material combinations such as, for example, molybdenum and beryllium, ruthenium and beryllium or lanthanum and $B_4C$, can also be used in place of silicon and molybdenum for the layers of the multi-layer coating.

Although one or more cover layer(s) and optionally present functional intermediate layers of the multi-layer coating could also theoretically be scaled by the common factor, this is not absolutely necessary and may simply result in the thickness of the coating increasing unnecessarily. The local change in thickness or the maximum thickness variation over the entire surface of the mask necessary for optimising the imaging is generally in this instance at least approximately 0.1% of the thickness averaged over the entire surface and is generally no more than approximately 10% of the averaged thickness, typical values being between approximately 0.5% and 7%.

In a development, the optical design of the multi-layer coating changes with position in dependence of a pitch of the mask structure. The pitch of the mask structure describes the period length of the mask structure or individual absorber structures of the mask in a structural direction, for example, parallel with or transversely to the scanning direction. In dependence of the (local) pitch, the optical design, particularly the thickness, of the multi-layer coating can be adapted in such a manner that the imaging of the mask structure is improved. In this instance, it is possible to reduce or minimise specific imaging errors, in particular telecentricity errors.

In another embodiment, the optical design of the mask structure is adapted to the optical design of the multi-layer coating which varies in dependence of position in order to improve the imaging of the mask in the EUV lithography system. In addition to optimising the optical design of the multi-layer coating, it is also possible to carry out optimising of the optical design of the mask structure itself by the (local) width of the structures of the absorber layer being adapted, it being particularly possible to provide the absorber structures with a lateral gradient (see below) and/or to optimise the thickness of the mask structure so that the imaging of the mask in an EUV lithography system can be further improved.

In this instance, use can be made of the fact that both the optical design of the mask structure and the optical design of the multi-layer coating have an influence on specific imaging errors, in particular the telecentricity error. The telecentricity error which is caused by the mask structure and which is attributable to the shadowing of the absorber layer or rigorous effects can therefore be (substantially) compensated for in the most favourable case by the telecentricity error which is caused by the variation in the reflectivity of the multi-layer coating in dependence of the angle of incidence. As set out above, total optimisation which takes into consideration both contributions to the telecentricity error is necessary for the quantitative determination of compensation.

It will be appreciated that it is optionally also possible to carry out optimisation of the mask, wherein the optical design of the multi-layer coating is independent of the position and the optical design of the mask structure, in particular the lateral profile and/or the absorber thickness, is adapted in a suitable manner so that the telecentricity error (as a mean over the entire surface) can be minimised. In this instance, the optical design of the multi-layer coating can be selected in particular in such a manner that the total thickness (which is constant over the surface) of the multi-layer coating or the thicknesses of the individual layers comprising Mo or Si are scaled in dependence of the numerical aperture or the CRA so that the imaging or reflectivity is generally optimised for the numerical aperture used, that is to say, local (positionally-dependent) optimisation of the thickness of the multi-layer coating may be dispensed with in this case.

In one embodiment, the thickness of the mask structure varies in a positionally-dependent manner in dependence of a pitch of the mask structure and/or the positionally-dependent optical design of the multi-layer coating. The inventors have found that, although the effect of the shadowing of the mask structure decreases as the thickness decreases, which has an advantageous effect on the imaging characteristics, the multi-layer coating to which the mask structure is applied has a decisive influence on the imaging characteristics of the mask in particular with relatively small thicknesses of the absorber layer of, for example, less than 100 nm, for the following reason.

For imaging, significant characteristic values such as the telecentricity error or the image contrast do not change monotonously in dependence of the thickness of the mask structure but instead have periodic variations in dependence of thickness. In this instance, the period length of the variations is associated with the optical design of the multi-layer coating and is also dependent inter alia on the (local) pitch of the mask structure. Consequently, selecting the thickness of the mask structure in a suitable manner has a decisive influence on the imaging quality. It was found during the investigations by the inventors that the variations of most relevant characteristic values of the imaging are substantially independent of the numerical aperture or CRA under which the mask is operated, that is to say, a thickness of the mask structure optimised for a specific chief ray angle or incidence angle range can also be used—with slight adaptations—for other chief ray angles.

In another embodiment, the mask structure has at least one absorber structure having a structural width which varies in the thickness direction, that is to say, the at least one absorber structure has a lateral gradient. The variation in structural width of the absorber structure in the thickness direction can be produced, for example, by a plurality of absorber layers being applied one on top of the other so that there is produced a stair-like structure in which the structural width changes at the transition between adjacent absorber layers.

In a development, at least one flank of the absorber structure has a flank angle which is different from 90°. Additionally or alternatively to the step-like variation of the width of an absorber structure, it is also possible to carry out a continuous change in the width of an absorber structure, for example, if the absorber structure is applied by means of a directional etching process. It will be appreciated that the change in the structural width in the thickness direction can also be selected in dependence of position (for example, in dependence of the pitch) in order to improve the imaging characteristics of the mask.

In another development, the at least one flank angle is between 70° and 88° or between 92° and 110°, in particular between 70° and 85° or between 95° and 110°. It has been found that even relatively small deviations of a binary mask structure, that is to say, a mask structure having a structural width which is constant in the height direction, can contribute to a substantial improvement during the imaging of the mask.

If the thickness of the absorber material is reduced relative to the conventional thickness of approximately 100 nm, the absorber material of the mask structure should have an absorption coefficient which is so large that sufficient absorption of the illumination light remains ensured in order not to worsen the image contrast.

Therefore, the absorber material advantageously has a k value (imaginary part of the refraction index) greater than 0.05, preferably more than 0.06, particularly preferably more than 0.07, in particular more than 0.08 for wavelengths in the EUV range, in particular at 13.5 nm.

In one embodiment of the mask, the absorber material is selected from the group comprising: platinum (Pt), zinc (Zn), gold (Au), nickel oxide (NiO), silver oxide ($Ag_2O$), iridium (Ir) and iron (Fe). Those materials have an absorption coefficient greater than 0.05 at wavelengths in the EUV range, that is to say, an absorption coefficient which is greater than tantalum nitride TaN which is conventionally used as the absorber material and whose k value is 0.0434.

In another embodiment, the absorber material is selected from the group comprising: tin dioxide ($SnO_2$), cobalt (Co), chromium nickel alloys, in particular $Ni_8Cr_2$, tin oxide (SnO) and copper (Cu). Those materials have an absorption coefficient (k value) of more than 0.06.

In one embodiment, the absorber material is selected from the group comprising: silver (Ag), actinium (Ac), tellurium (Te), caesium iodide (CsI) and tin (Sn). Those materials typically have for the currently relevant wavelengths an absorption coefficient of k=0.07 or above.

In another embodiment, the absorber material is selected from the group comprising: nickel (Ni), silver (Ag) and zinc telluride (ZnTe) which each have an absorption coefficient of more than 0.08. Particularly nickel is very suitable as an absorber material because it has an absorption coefficient greater than 0.09.

In another embodiment, the multi-layer coating of the mask has a cover layer which is adapted to the absorber material of the mask structure. The multi-layer coating is coated with the absorber material so that the adhesive properties of the absorber layer on the multi-layer coating depend on the material of the cover layer to which the absorber layer is applied. Therefore, it is advantageous to select the materials of the cover layer and the absorber layer so as to be compatible, that is to say, to use materials which have similar chemical or structural characteristics, so that good adhesion of the absorber layer on the cover layer is ensured.

Another aspect of the invention is carried out in an EUV lithography system comprising: a mask which is constructed as described above, an illumination system for illuminating the mask with illumination light and an objective lens for imaging the mask onto a substrate. As already set out above, the reflective mask is not operated in the telecentric beam path so that shadowing effects or rigorous effects which, for example, can be reduced by a small thickness of the absorption layer, are produced.

In one embodiment, the thickness of at least one absorber structure of the mask structure deviates by no more than 1.5 nm, preferably by no more than 0.5 nm, in particular by no more than 0.2 nm, from a thickness at which at least one characteristic value of the EUV lithography system relevant to the imaging of the mask, in particular a telecentricity error or an image contrast, has a minimum or a maximum. As described above, characteristic values relevant to the imaging, such as the telecentricity error or the image contrast, vary in dependence of the thickness of the mask structure. Therefore, the thickness of the mask structure or the absorber can be adjusted so that the above-mentioned characteristic values are optimised, that is to say, maximised or minimised, for example, in that the telecentricity error is minimised or the image contrast is maximised.

In this instance, the thickness of the mask structure can be selected so as to be constant over the entire surface of the mask. However, it is also possible to change the thickness of the mask structure locally, that is to say, to change the thickness of individual absorber structures, for example, in dependence of a (local) pitch and/or positionally-dependent variation of the optical design of the multi-layer coating, in order to further optimise the imaging.

In another embodiment, the mask structure has a structural width which varies in the thickness direction and which is selected so that at least one characteristic value of the EUV lithography system relevant to the imaging, in particular a telecentricity error or an image contrast, is improved over a mask structure having a structural width which is constant in the thickness direction. If the characteristic value relevant to the imaging is an imaging error, it can be reduced or minimised by suitable selection of the structural width of the absorber structures in the thickness direction. However, other characteristic values, for example, the image contrast, can also be improved by a lateral gradient of the absorber structures.

In another embodiment, the multi-layer coating has a positionally-dependent variation of the optical design which is selected in such a manner that at least one characteristic value of the EUV lithography system relevant to the imaging of the mask, in particular a telecentricity error or an image contrast, is improved over a multi-layer coating having an optical design which is not dependent on position. As described above, the optical design of the multi-layer coating can be optimised, for example, by local variation of the layer thicknesses dependent on the mask structure used (in particular the pitch). It is particularly possible, by means of an optical design selected in a suitable manner, for example, a suitably selected thickness of the multi-layer coating in dependence of the position, for the telecentricity error to be reduced or minimised, or other characteristic values of the imaging can be improved or optimised. In this instance, the positionally-dependent change of the optical design can be carried out on the basis of an optical design which is not dependent on position and which is optimised for a specific numerical aperture or a specific CRA (and optionally for specific illumination settings).

In one embodiment, the optical design of the mask structure is adapted to the positionally-dependent variation of the optical design of the multi-layer coating in order to further improve the at least one characteristic value. As already set out above, the imaging can be further improved by adaptation of the optical design of the mask structure to the optical design of the multi-layer coating and, in particular, the telecentricity error can be reduced or minimised. In this instance, in particular the thickness of the absorber layer and the lateral profile of the absorber layer can be adapted in a suitable manner.

In one embodiment, the multi-layer coating has, in at least a part-region of the mask, a thickness which is selected in such a manner that at least one characteristic value of the EUV lithography system relevant to the imaging of the mask, in particular a telecentricity error or an image contrast, is improved over a thickness at which the reflectivity of the multi-layer coating is optimised for the incidence angle range of the EUV lithography system.

In that embodiment, the thickness of the multi-layer coating deviates at least in the part-region, in particular over the entire surface of the mask, from a layer design having a (constant) layer thickness which is optimised for the incidence angle range of the EUV lithography system, that is to say, wherein the reflectivity is as great as possible and is as constant as possible over the entire incidence angle range. In order to achieve reflectivity, which is as high and constant as possible, for a predetermined numerical aperture, such an optical design may comprise optimisation (not dependent on position) of the layer thickness of each individual layer of the multi-layer coating. There is thereby formed a multi-layer coating in which the thicknesses of the alternating layer materials may no longer be repeated periodically (aperiodic design). On the basis of that design (not dependent on position), there is carried out in the part-region local adaptation of the optical design or a local change in thickness which is dependent on the mask structure (in particular the pitch) at the location, respectively.

In another embodiment, the EUV lithography system has, during the imaging of the mask, a telecentricity error between −0.5 mrad and 0.5 mrad, preferably between −0.3 mrad and 0.3 mrad, in particular between −0.1 mrad and 0.1 mrad. Such small telecentricity errors can be brought about by the above-described optimising of the mask.

In one embodiment, the objective has a numerical aperture of 0.2 or more, preferably 0.4 or more, particularly preferably 0.5 or more. With a high numerical aperture, selecting an absorber layer having a small thickness is particularly advantageous because the chief ray angle increases with an increasing numerical aperture.

In another embodiment, the EUV lithography system is configured to operate the mask at a chief ray angle of at least 5°, preferably at least 8°. Since the chief ray angle also increases (in an approximately linear manner) with an increasing numerical aperture, the above-described disadvantageous effects increasingly occur as the chief ray angle increases so that an optimised mask in this instance has a particularly advantageous effect.

Another aspect of the invention relates to a method for optimising the imaging of a mask in an EUV lithography system, the mask comprising: a substrate, a multi-layer coating applied to the substrate and a mask structure which is applied to the multi-layer coating and which has an absorber material, the optical design of the multi-layer coating in dependence of the mask structure and/or the optical design of the mask structure being selected in order to optimise the imaging in such a manner that at least one characteristic value of the EUV lithography system relevant to the imaging of the mask is improved, in particular maximised or minimised. For example, the telecentricity error, the image contrast and/or the apodising during imaging can be improved or optimised by adapting the optical design of the mask. For optimising the optical design of the multi-layer coating, in particular the thicknesses of the individual layers may be adapted in dependence of position. In order to optimise the optical design of the mask structure, the thickness of the mask structure and/or the lateral profile of the absorber layer or the absorber structures can be adapted in a suitable manner.

When a mask is provided for EUV lithography, it is generally advantageous also to carry out adaptation of the type and/or thickness of the absorber material in dependence of the numerical aperture or the chief ray angle CRA of the EUV lithography system, in which the mask is operated. It has been found that suitable absorber materials and optionally also the layer thicknesses are dependent on the selected numerical aperture, it not being advantageous for each aperture range if the thickness of the absorber layer is as small as possible and the absorption of the absorber material used is as large as possible. Instead, the layer thickness and the type of the absorber material must be selected carefully in order to achieve an optimised imaging quality.

It is also possible to apply, in place of a mask structure which has a single absorber layer, two or more absorber layers on top of each other which may also comprise different materials. As set out above, in this instance the absorber layers may have, for example, a different lateral extent so that the mask structures have a stair-like profile or a profile with oblique edges in place of a rectangular profile. Such a lateral profile can be adjusted by a suitable etching process. Consequently, corrections may be carried out in EUV masks by suitable adaptation of the lateral profile of the absorber layer and, for example, serve to correct the shadowing or to reduce the telecentricity error.

It will be appreciated that the multi-layer coating can also be modified in a suitable manner for the operation with a high numerical aperture because the angular range at which the mask is used also increases with the numerical aperture so that the multi-layer coating must act reflectively for a wide angular range. In this instance, both the adaptation of the multi-layer coating and the absorber layer can in particular be carried out in such a manner that optimum imaging is possible taking into consideration the illumination distribution and the transmission of the projection objective (Jones pupil) and other parameters relevant to the imaging. In this instance, in particular the illumination distribution (for example, a setting) in the object plane can also be adapted to the mask structure used (so-called source/mask optimisation) in addition to adapting the optical design of the mask.

Other features and advantages of the invention will be appreciated from the following description of embodiments of the invention, with reference to the Figures of the drawings, which show inventively significant details, and from the claims. The individual features can be implemented individually or together in any combination in a variant of the invention.

BRIEF DESCRIPTION OF THE DRAWINGS

Embodiments are illustrated in the schematic drawings and are explained in the following description. In the drawings.

DETAILED DESCRIPTION OF VARIOUS EMBODIMENTS

Figure 1:
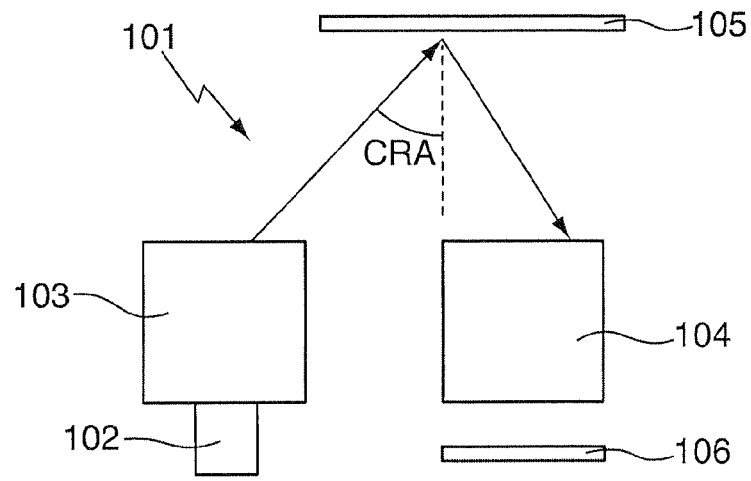
FIG. 1 is a schematic illustration of an EUV lithography system.

FIG. 1 illustrates an EUV lithography system 101 which has a beam shaping system 102, an illumination system 103 and a projection system 104 which are each accommodated in separate vacuum housings and which are arranged successively in a beam path which begins from an EUV light source (not illustrated) of the beam shaping system 102. For example, a plasma source or a synchrotron can be used as the EUV light source. The radiation being discharged from the EUV light source in the wavelength range between approximately 5 nm and approximately 20 nm is first bundled in a collimator (not illustrated); the desired operating wavelength, which is 13.5 nm in the present embodiment, is filtered out by the angle of incidence being varied by a downstream monochromator (not illustrated).

The radiation which is processed in the beam shaping system 102 with regard to wavelength and spatial distribution is introduced into the illumination system 103 which has optical elements (not illustrated) which serve to shape illumination radiation which is directed to a mask 105 at a chief ray angle (CRA) of approximately 8°. The mask 105 is imaged onto a wafer 106 to a reduced scale by the projection system 104. To that end, the projection system 104 has other reflective optical elements (not illustrated).

Figure 2:
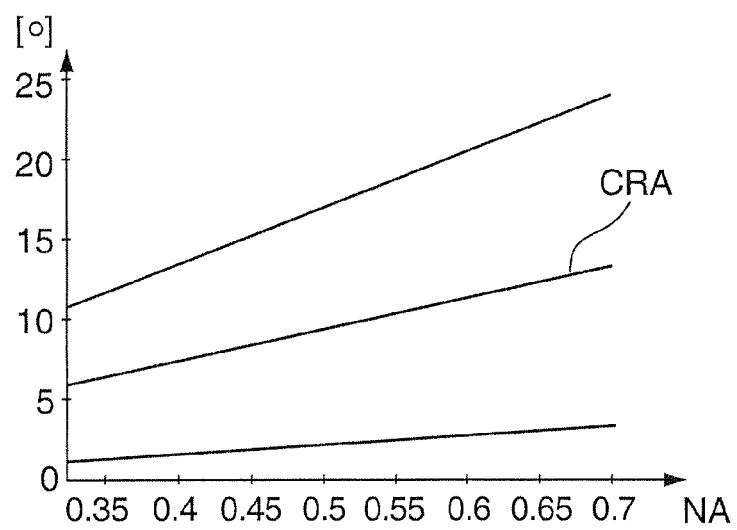
FIG. 2 is an illustration of the chief ray angle and the angular spectrum in dependence of the numerical aperture.

The (practically) linear dependence of the chief ray angle CRA on the numerical aperture of the projection system 104 (also referred to as the projection objective below) is illustrated in FIG. 2. A first line which lies over the straight line of the chief ray angle CRA marks the maximum angle of incidence of the radiation which strikes the mask 105 and a second lower line indicates the minimum angle of incidence of the illumination light on the mask 105. Although the angle is theoretically 0°, it is typically selected so as to be slightly greater than 0° for technical reasons relating to construction space. In the present example, the minimum angle of incidence increases in a linear manner with an increasing numerical aperture NA. However, it will be appreciated that this does not necessarily have to be the case because of the construction type, that is to say, the minimum angle of incidence may be independent, for example, of the numerical aperture. In the example shown in FIG. 2, the angular range of the radiation striking the mask 105 increases with an increasing numerical aperture NA.

Figure 3A:
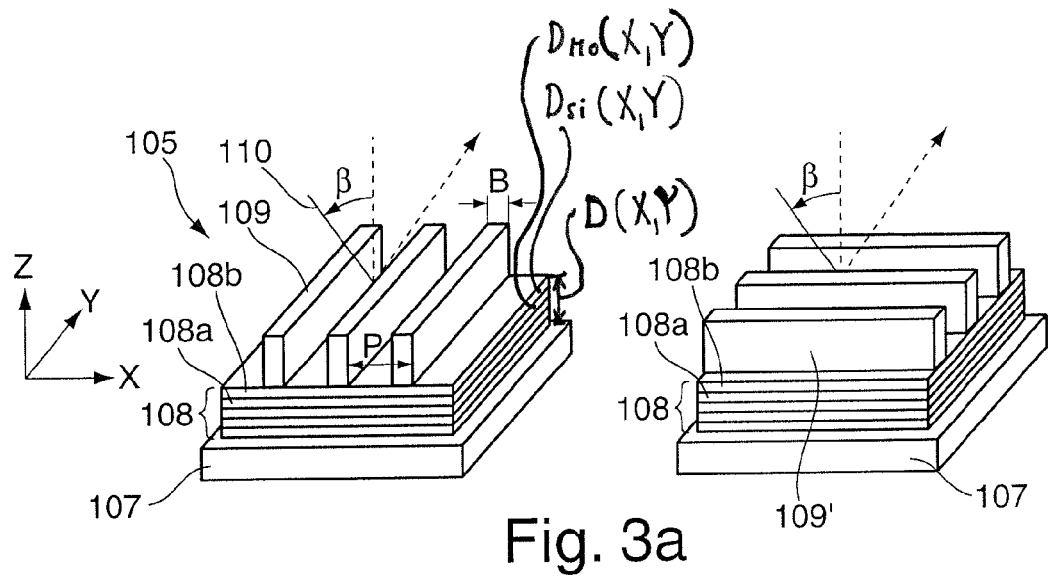
FIGS. 3a-c are schematic illustrations of a mask for the EUV lithography system of FIG. 1 which has a structured layer (mask structure) having an absorber material, FIGS. 4a, b are graphs of the CD in dependence of the pitch for H and V absorber structures with different thicknesses of the mask structure.

The occurrence of rigorous effects on the mask 105 during operation of the EUV lithography system 101 with relatively large chief ray angles or high numerical apertures is described below with reference to FIGS. 3a-c. The mask 105 has a glass substrate 107 comprising, for example, ULE™ or Zerodur®, to which a multi-layer coating 108 is applied. In the present case, the multi-layer coating has a large number of alternating layers 108a, 108b of silicon or molybdenum which is highly reflective for illumination light at a wavelength of approximately λ=13.5 nm. A mask structure 109, which comprises a structured layer of tantalum nitride (TaN) in FIG. 3a which acts as an absorption layer for absorbing the illumination radiation, is applied to the multi-layer coating 108.

The left-hand illustration shows the incidence of the illumination light 110 when the mask structure 109 has a plurality of H structures 109a. The dimension orthogonal relative to the surface of the substrate 107 is designated Z in this instance and corresponds to the dimension in which the thickness of the TaN structures 109 is approximately 50 nm. The H structures 109a have a greater extent in the Y direction than in the X direction of an XYZ coordinate system shown in FIG. 3A. If a beam of illumination light 110 strikes the mask 105 at an angle β>0°, for example, 6°, 8° or 12°, relative to the direction Z, a shadowing effect occurs at the H structure 109a for the reflected beam which is illustrated in an interrupted manner in this instance. In the mask structure 109 shown in the right-hand illustration, the absorber structures 109'a are in the form of V structures so that this shadowing effect does not occur.

The width of a mask structure, for example, the H structure 109a in the left-hand illustration, corresponds to its extent b in the X direction. The pitch of the H structure indicates the period length of the H structures and is designated p in the X direction in FIG. 3a. This applies accordingly to the V structure 109'a shown in the right-hand illustration in relation to the Y direction.

Figure 3B:
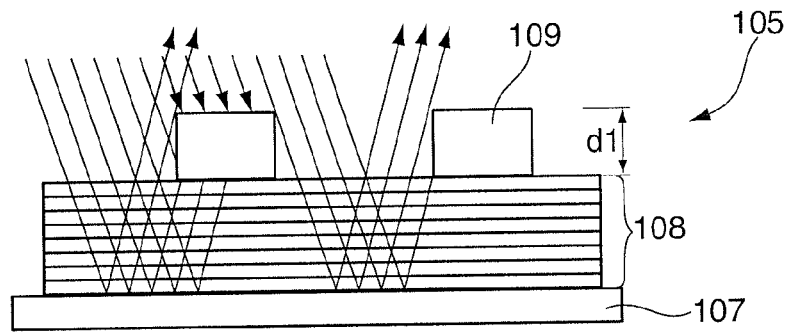

FIG. 3b illustrates the shadowing effect from a perspective within the object plane of the objective lens 104 in an H structure 109a having a thickness d1 of 50 nm. The illumination light strikes the multi-layer coating 108 from the left, is reflected therein and it can be seen that there occurs, at the right-hand H structure 109a, shadowing which is of a purely geometric type and which depends on the effective location of the reflection of the illumination light in the multi-layer coating 108. FIG. 3c illustrates the shadowing effect in an absorber layer (H structure) 109 having a smaller thickness of d2=20 nm. A comparison of FIG. 3b with FIG. 3c shows that the shadowing decreases owing to the smaller absorber thickness and more illumination radiation is reflected.

Figure 4A:
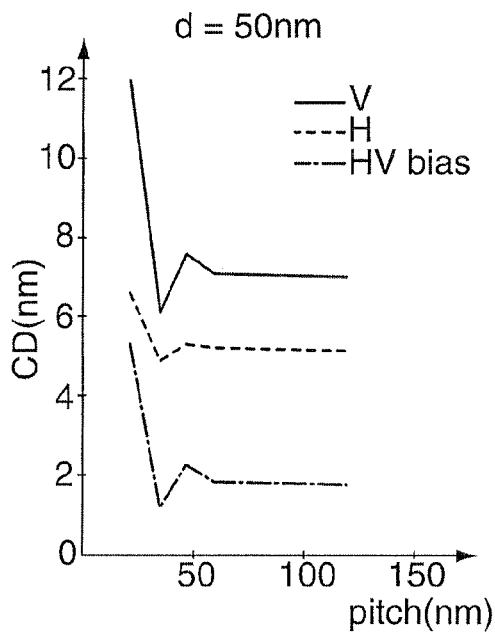
Figure 4B:
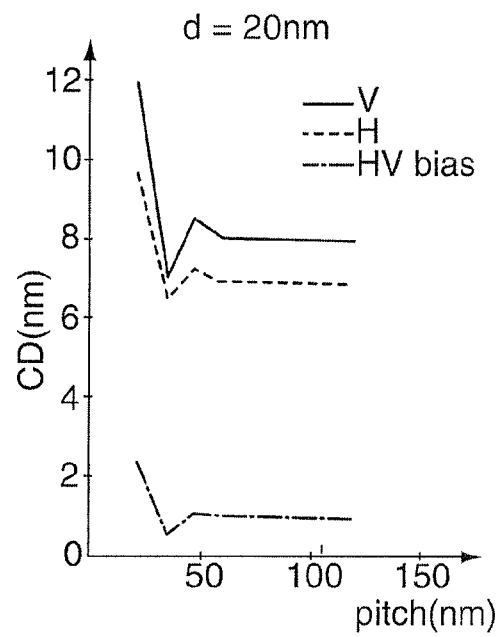

FIGS. 4a,b illustrate for the thicknesses d1=50 nm and d2=20 nm shown in FIGS. 3b,c the CD, that is to say, the structural width on the mask (in the wafer scale, that is to say, four times smaller in dependence of the imaging scale) in order to produce structures having a CD (that is to say, a structural width) of 12 nm on the wafer 106 in dependence of the pitch for an H structure and a V structure and in addition the HV bias, that is to say, the difference between the critical dimension CD of the H structure and the V structure. In addition to the fact that the CD of the structures on the mask for producing a predetermined CD on the wafer is dependent on the pitch, it can also clearly be seen in FIGS. 4a,b that the HV bias is substantially smaller when a mask structure having a thickness d2 of 20 nm is used than when a mask structure having a thickness d1 of 50 nm is used. Consequently, the selection of a mask structure having the thickness d2 of 20 nm is more advantageous than using an absorber layer having a thickness d1 of 50 nm with the chief ray angle CRA used of approximately 10°, which corresponds to a numerical aperture of approximately 0.55, because this reduces the HV bias.

Figure 5:
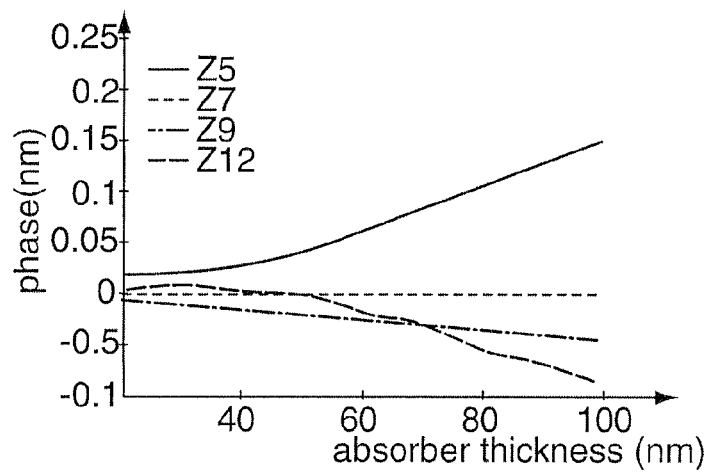
FIG. 5 is a graph with Zernike coefficients in dependence of the thickness of the absorber material of a mask.

In addition to the effect that H structures 109a are generally imaged in a wider manner in dependence of their position in the object plane of the objective lens 104, there is also produced for H structures a displacement of the image dependent on the focal position of the mask which corresponds to a field-dependent tilt of the wave front (Zernike coefficients Z2, Z3). If the entire wave front is analysed, there are produced as aberrations field-dependent distortion terms Z2, Z3, focus variations Z4 and astigmatism Z5, Z6. These are accompanied by wave front errors of higher orders such as comas Z7, Z8 and secondary astigmatism Z12, Z13. As can be seen in FIG. 5, the effects mentioned generally increase with increasing thickness of the mask structure 109 (absorber layer).

Consequently, it is advantageous to reduce the thickness of the mask structure 109 to 30 nm or below, for example, to 20 nm or less, in particular to 10 nm or less. In this instance, however, it should remain ensured that the mask structure 109 keeps its absorbent properties, that is to say, the absorber material selected for the mask structure should have a sufficiently large absorption coefficient for it to retain its function, with the selected thickness of the absorber layer, of absorbing the illumination light 110 so that the image contrast is not reduced.

Possible absorber materials for the mask structure 109 are listed below in order of their absorption coefficient (k coefficient), the following listing combining data from various standard works with material data, for which reason some materials are set out several times and with different k values. Those differences can be explained in part in that the experimental measurement of the k values is difficult. In addition to the type of material, the coating method which was used to apply the absorber material may also influence the k value.

k>0.09
Ni k=0.091100
k>0.8
Ag: k=0.082400
ZnTe: k=0.082000
k>0.07
Ag: k=0.078893
Ac: k=0.077757
Te: k=0.076700
CsI: k=0.074462
Cu: k=0.074400
Ni: k=0.072428
Sn: k=0.072003
Co: k=0.070000
k>0.06
$SnO_2$: k=0.066637
Co: k=0.065988
Ni $Cr_2$: k=0.064931
SnO: k=0.062664
Cu: k=0.060941
k>0.05
Pt: k=0.059502
Zn: k=0.055417
Au: k=0.055400
NiO: k=0.054749
$Ag_2O$: k=0.054140
Ir: k=0.053200
Fe: k=0.051962
Au: k=0.051322

Figure 6:
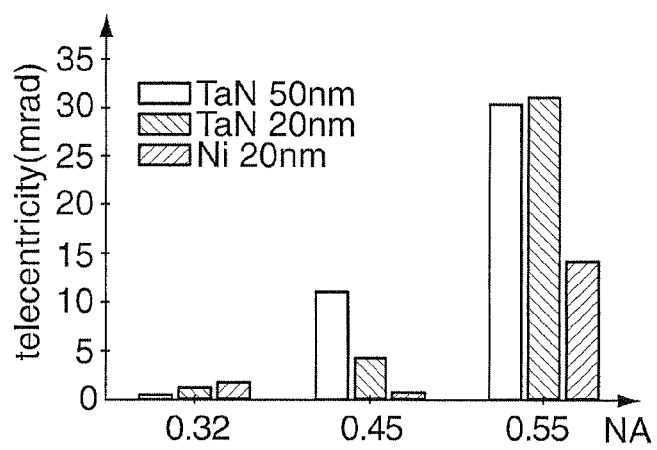
FIG. 6 shows the dependency of the telecentricity error on the thickness and the type of the absorber material.

One may suppose that the use of an absorbent material which is as powerful as possible for the mask structure 109, 109' is advantageous in each case, that is to say, irrespective of the numerical aperture NA, but this is not the case as shown by FIG. 6. Therein, the telecentricity error is shown for a numerical aperture NA of 0.32, 0.45 and 0.55 for an absorber layer comprising TaN having a thickness of 50 nm and 20 nm and an absorber layer of nickel Ni which has the highest absorption coefficient of the materials of the above list.

As expected, an absorber layer of nickel having a thickness of 20 nm is advantageous for a numerical aperture NA of 0.45 and 0.55 because it reduces the telecentricity error (in mrad). However, this is not the case for a numerical aperture of 0.32. In this instance, the rigorous effects result in the telecentricity error decreasing with increasing thickness of the absorber layer and being greater when nickel is used as the absorber material than when tantalum nitride is used.

Consequently, the establishment of a suitable thickness of the mask structure and a suitable absorber material for a predetermined numerical aperture or predetermined chief ray angle CRA is not trivial, that is to say, it cannot readily be predicted which material and which thickness is particularly advantageous for a predetermined NA, that is to say, which minimises the imaging errors of the projection objective 104 resulting owing to rigorous effects and shadowing.

It will be appreciated that the imaging can be optimised with regard to different imaging errors, ideally with other imaging errors being optimised at the same time by an imaging error being optimised or only slight adaptations having to be carried out with regard to the other imaging errors. For example, the image contrast can be optimised in that the thickness of the absorber layer and the absorber material are selected so that the mask acts as an attenuated phase mask which has a phase shift in the range around approximately 180°.

Figure 3C:
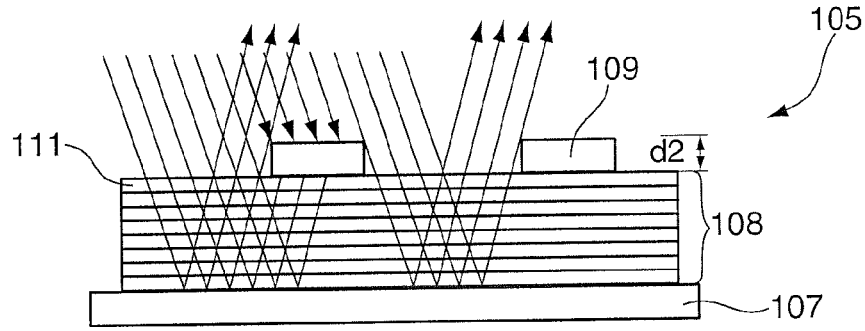

Another point which must be considered when the absorber material is selected involves the compatibility of the absorber material with the multi-layer coating 108 (cf. FIG. 3c). The multi-layer coating 108 has for protection a cover layer 111 which may comprise, for example, ruthenium when chromium is used as the absorber material. The material of the cover layer 111 and the material of the absorber layer should be selected so that it is readily possible to apply the absorber layer 109 to the cover layer 111 so that the absorber layer 109 adheres to the cover layer 111 as well as possible and undesirable effects such as delamination do not occur.

In summary, the thickness of the absorber layer and the absorber material have to be selected in a suitable manner in dependence of the numerical aperture and other conditions such as, for example, the material of the cover layer, in order to obtain optimum imaging quality.

Figure 7:
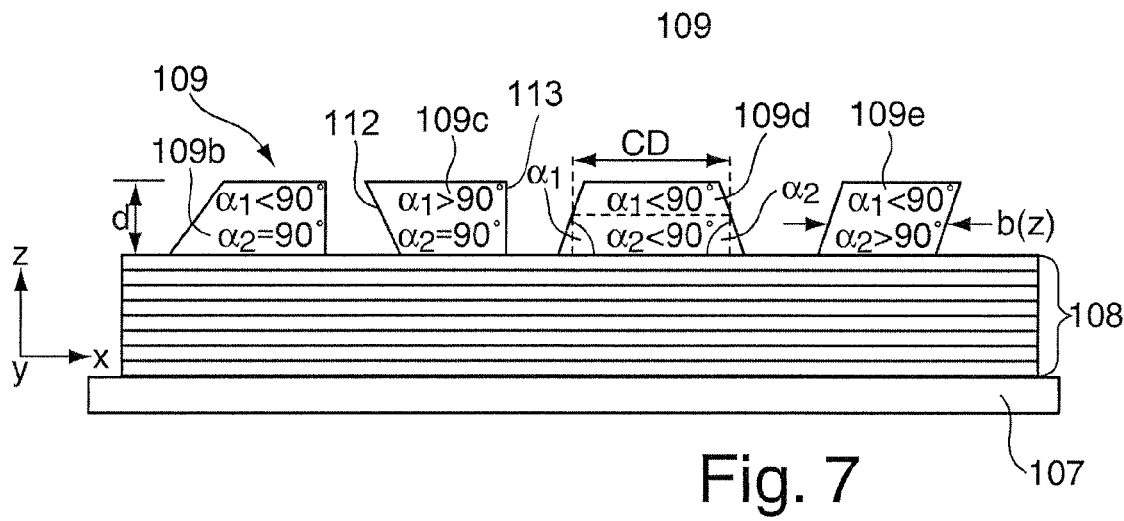
FIG. 7 shows examples of absorber structures having different lateral profiles.

In order to improve the imaging quality, in particular the mask structure 109 or, more precisely, individual absorber structures 109b to 109e, may have a lateral gradient, that is to say, a width b(Z) which varies in the thickness direction Z perpendicularly to the X,Y plane with the substrate 107, cf. FIG. 7. In the absorber structures 109b to 109e shown in FIG. 7, at least one of the two mutually opposing flanks 112, 113 define(s) a flank angle $\alpha_1$, $\alpha_2$ which is different from 90° with the multi-layer coating 108. As also shown in FIG. 7, a flank angle $\alpha_1$, $\alpha_2$ may be either greater or smaller than 90°, it being possible to produce the profiled absorber structures 109b to 109e, for example, by directional etching using a greyscale mask because the flank angles $\alpha_1$, $\alpha_2$ necessary to improve the imaging quality differ only slightly from a right angle, that is to say, typically by a maximum of 20°, that is to say, typically within a range between 70° and 110°.

As can also be seen in FIG. 7, the so-called critical dimension (line width) of the absorber structures 109b to 109e is determined for half the thickness d/2 when a lateral gradient is present. It will be appreciated that it is also possible to carry out a step-like or stair-like variation of the width b(Z) in the thickness direction Z as an alternative to continuous variation of the width b(Z) by utilizing the inclined flanks 112, 113, for example, if a plurality of absorber layers having different lateral extents are applied on top of each other.

An example of optimising the imaging quality by the flank angle $\alpha_1$, $\alpha_2$ being selected appropriately was carried out by the simulation of rigorous effects for an absorber structure 109b, 109c, wherein the first flank angle $\alpha_1$ was varied for the optimisation and the second flank angle $\alpha_2$ was selected so as to be 90°.

A numerical aperture NA of 0.25 and a conventional (coherent) illumination having a σ setting of 0.5 was taken as a basis for the simulation. There were used as absorber structures lines having a width b of 27 nm on the wafer (measured in a direction parallel with the plane of the incident chief ray), the period length or the pitch being varied. In this instance, the thickness d of the absorber structures was 70 nm, TaN being used as the absorber material (n=0.9429+0.0408 i) for the simulations. Forty double layers of molybdenum and silicon were taken as a basis for the multi-layer coating 108. A refraction index of $n_{Mo}$=0.923+0.00622 i and a thickness $D_{Mo}$ of 2.78 nm were selected for the simulation of the molybdenum layer. Accordingly, a refraction index of $n_{Si}$=0.999+0.00182 i and a thickness $D_{Si}$ of 4.17 nm were assumed for the simulation of the silicon layer.

The following result was produced for binary absorber structures ($\alpha_1=\alpha_2=90°$):

TABLE 1

| Pitch [nm] | 54 | 81 | 108 | 135 | 162 | 189 | 216 |
|---|---|---|---|---|---|---|---|
| Mask CD [nm] | 24.6 | 18.2 | 17.0 | 17.8 | 18.2 | 17.4 | 17.8 |
| Telecentricity error [mrad] | 2.2 | 4.2 | 3.5 | 3.6 | 3.4 | 3.7 | 3.4 |

In contrast, the following results were obtained for the variation or optimising of the first flank angle $\alpha_1$:

TABLE 2

| Pitch [nm] | 54 | 81 | 108 | 135 | 162 | 189 | 216 |
|---|---|---|---|---|---|---|---|
| Mask CD [nm] | 22.6 | 18.6 | 15.8 | 15.4 | 17.0 | 17.0 | 16.2 |
| Flank angle $\alpha_1$ | 82 | 82 | 98 | 98 | 80 | 98 | 80 |
| Telecentricity error [mrad] | −0.2 | 1.9 | 0.2 | 0.2 | −0.2 | 0.4 | −0.2 |

In this instance, the term mask CD is intended to be understood to be the line width on the mask, the imaging scale not being taken into account (wafer scale). Therefore, the values of the mask CD in Table 1 and Table 2 still have to be scaled with the imaging scale in order to obtain the actual line width on the mask. In the present example of imaging which is reduced by a factor of 4, consequently, those values must be multiplied by a factor of 4. As can be seen with reference to Table 1 and Table 2, the line width on the mask was varied in this instance in dependence of the pitch in order to obtain the desired (constant) line width during imaging on the wafer. Such a variation of the line width on the mask in dependence of the pitch is also referred to as "optical proximity correction".

Figure 8:
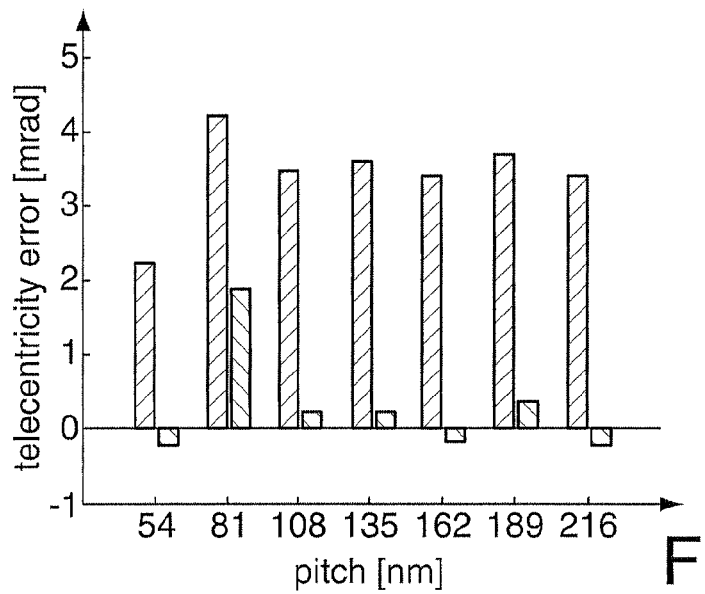
FIG. 8 is an illustration of the telecentricity error in dependence of the pitch of the absorber structures with a binary profile and with an adapted lateral profile.

The telecentricity errors set out in the tables are also illustrated graphically in FIG. 8, the first bar corresponding to the telecentricity error in Table 1 and the second bar corresponding to the telecentricity error in Table 2.

As can clearly be seen with reference to FIG. 8, the imaging can be optimised or the telecentricity error can be substantially reduced by suitable selection of the lateral gradient, the optimum value for the first flank angle $\alpha_1$ depending on the pitch and may be greater or smaller than 90°. In order to optimise the imaging, therefore, the flank angle $\alpha_1$ can be varied suitably in dependence of position in dependence of the mask structure 109 or the local pitch. If the production complexity is intended to be reduced, a uniform flank angle independent of the pitch may also be defined for the entire mask structure 109. This is particularly advantageous if the local pitch of the mask structure varies only within a relatively small range.

Figure 9:
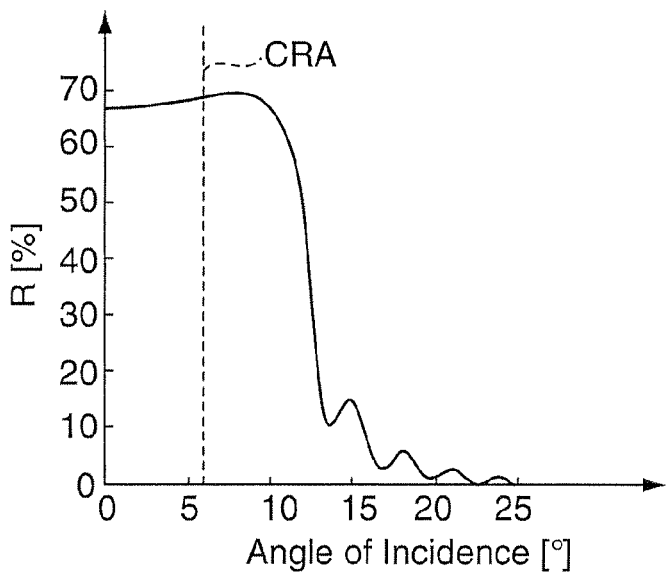
FIG. 9 is an illustration of the reflectivity of a multi-layer coating in dependence of the angle of incidence.

Additionally or alternatively to optimising the geometry of the mask structure by using a lateral profile, the optical design of the multi-layer coating 108 can also be optimised in order to improve the imaging quality. In this instance, it should be noted that a conventional multi-layer coating 108 for EUV radiation has a reflectivity R dependent on the angle of incidence, as illustrated in FIG. 9 by way of example. Although the reflectivity R is above 67% in an incidence angle range between 0° and approximately 10°, the reflectivity R also varies substantially in that range in the exemplary periodical design of the multi-layer coating 108 by approximately 2%.

This variation in the reflectivity R over the incidence angle range used results in a variation of the apodisation in the object pupil, a tilt constituting a substantial portion owing to the asymmetric variation. One consequence of this effect is a telecentricity error during imaging. Since the mask structure 109 also produces a telecentricity error (cf. FIG. 6), the telecentricity error of the multi-layer coating 108 can be selected in such a manner that the total effect of the mask 105, that is to say, the multi-layer coating 108 and the mask structure 109 applied thereto, minimises the telecentricity error or, more generally, the apodisation.

In order to optimise the optical design of the multilayer coating 108, in particular the thickness $D_{Si}(X,Y)$ of the individual layers 108a of silicone, and the thickness $D_{Mo}(X,Y)$ of the individual layers 108b of molybdenum can be selected appropriately. In this instance, first the thickness of the total multi-layer coating 108 (without the cover layer 111, cf. FIG. 3c) is fixed in dependence of the chief ray angle or the numerical aperture so that it produces a reflectivity R which is as high as possible and which is as homogeneous as possible over the angle of incidence, e.g. as shown in FIG. 9. On the basis of that design optimised for the numerical aperture, positionally-dependent optimising can then subsequently be carried out, in the simplest case local scaling of the thickness of the multi-layer coating 108 with a positionally-dependent factor.

For simulating such a multi-layer coating 108 taking into consideration rigorous effects, a numerical aperture NA of 0.45, a chief ray angle of 8° and annular illumination with a σ setting of 020/090 were taken as a basis, that is to say, annular illumination in which the lower limit of the σ value was 0.2 and the upper limit of the σ value was 0.9. Lines having a width b of 16 nm on the wafer were selected as absorber structures, the period length or the pitch p (cf. FIG. 3a) being varied. In this instance, the thickness d of the absorber structures was 56 nm, TaN being used as the absorber material (n=0.9429+0.0408 i) and a binary absorber geometry ($\alpha_1=\alpha_2=90°$) have been used for the simulations.

Forty double layers comprising molybdenum and silicon were taken to constitute the multi-layer coating 108. For the simulation of the molybdenum layers, the refraction index was $n_{Mo}$=0.923+0.00622 i and the thickness $D_{Mo}$ was 2.82 nm. Accordingly, a refraction index of $n_{Si}$=0.999+0.00182 i and a thickness $D_{Si}$ of 4.23 nm were taken as a basis for the simulation of the silicon layer, that is to say, the thickness D of the multi-layer coating was increased by 1.4% or multiplied by a factor f=1.014 in relation to the coating which was explained above in conjunction with Tables 1 and 2 for a numerical aperture NA of 0.25. The results of the simulation are set out in the following table:

TABLE 3

| Pitch [nm] | 32 | 48 | 64 | 80 | 96 | 112 | 128 |
|---|---|---|---|---|---|---|---|
| Mask CD [nm] | 12.2 | 12.9 | 12.8 | 12.6 | 12.7 | 12.5 | 12.3 |
| Telecentricity error [mrad] | −5.5 | 1.9 | 3.4 | 3.0 | 3.4 | 3.2 | 3.1 |

As can be seen with reference to Table 3, the telecentricity error is dependent on the pitch. Therefore, it is advantageous to carry out a positionally-dependent variation of the thickness D of the multi-layer coating 108 which is dependent on the local geometry of the mask structure 109 or, more precisely, the local period length (pitch) of the mask structure 109. The result of such a thickness optimisation in dependence of the pitch can be seen in the table below:

TABLE 4

| Pitch [nm] | 32 | 48 | 64 | 80 | 96 | 112 | 128 |
|---|---|---|---|---|---|---|---|
| Mask CD [nm] | 11.4 | 12.8 | 12.6 | 12.5 | 12.6 | 12.4 | 12.2 |
| Thickness change in % (relative to ML for NA = 0.25) | 2.4 | 1.1 | 0.9 | 1.0 | 1.0 | 1.0 | 1.0 |
| Thickness change in % (relative to initial ML) | 0.99 | −0.30 | −0.49 | −0.39 | −0.39 | −0.39 | −0.39 |
| Telecentricity error [mrad] | 0.23 | −0.36 | −0.35 | −0.13 | 0.17 | 0.01 | −0.09 |

Figure 10:
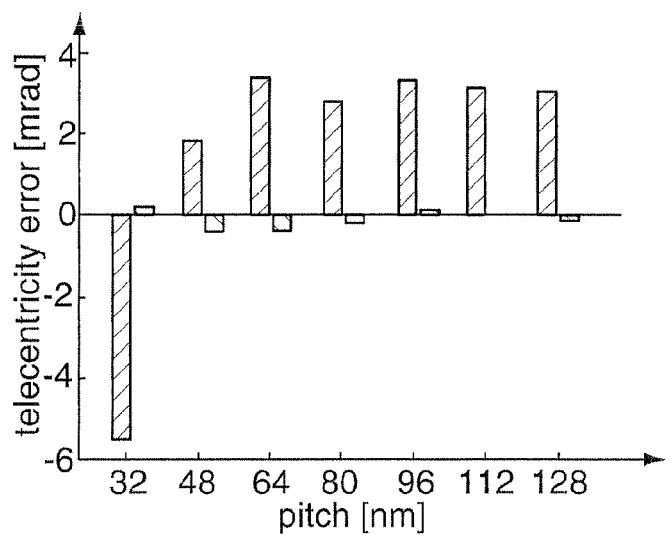
FIG. 10 is an illustration of the telecentricity error in dependence of the pitch with and without optimisation of the layer thickness of a multi-layer coating.

The term initial multi-layer (ML) is intended to be understood to be the multi-layer coating which is described with reference to Table 3 and which is optimised for a numerical aperture of 0.45 and which has a thickness increased by 1.4% over the multi-layer coating of Table 1 and Table 2 which is optimised for a numerical aperture of 0.25 and conventional illumination. As can be seen in particular with reference to FIG. 10 which compares the telecentricity errors set out in Table 3 and Table 4, it is possible to achieve a substantial reduction in the telecentricity error by the thickness D(X,Y) of the multi-layer coating 108 being adapted in dependence of the pitch.

In the values set out in Table 4, the critical dimension, that is to say, the line width of the absorber structures or the mask structure 109, was adapted or optimised (OPC) at the same time, the illumination adjustments also being taken into consideration during optimisation.

It is explained below with reference to FIG. 11 and FIG. 12 how the thickness of the mask structure 109 or the absorber layer can be optimised in a suitable manner in order to optimise relevant characteristic values such as the image contrast (cf. FIG. 11) or the telecentricity error (cf. FIG. 12) for imaging the mask 105. For that purpose, a (two-dimensional) simulation calculation was carried out taking into consideration rigorous effects for two different numerical apertures of 0.33 or 0.45 in dependence of a chief ray angle of 6° or 8°. The multi-layer coating 108 was selected as described above, a scaling factor f of 1.0062 or 1.0160 being used in relation to the thickness of the coating described in Tables 1 and 2. A conventional setting with a σ value of 0.5 was selected as the illumination, the pitch p was 1.1×13.5 nm/NA and nickel was selected as the material of the absorber layer.

Figure 11:
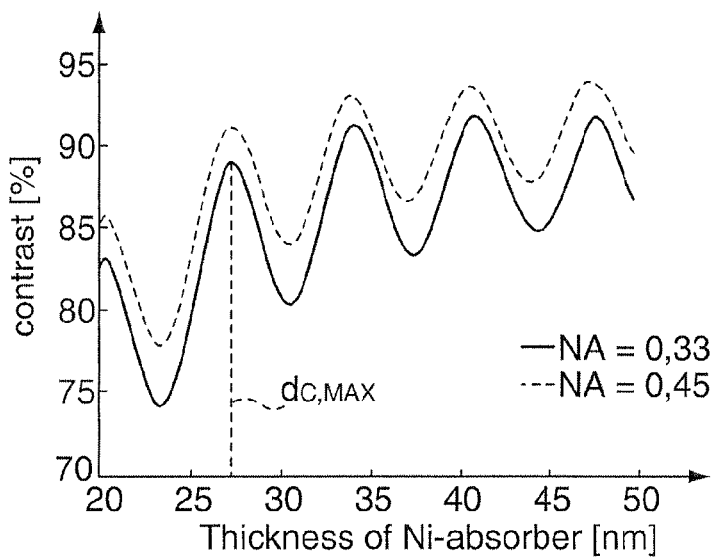
FIG. 11 is an illustration of the variation of the image contrast in dependence of the thickness of the absorber layer and FIG. 12 is an illustration of the variation of the telecentricity error in dependence of the thickness of the absorber layer.
Figure 12:
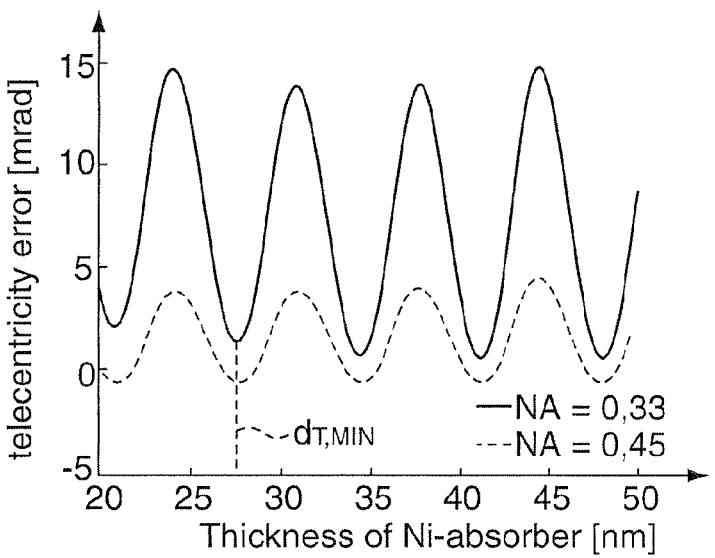

As can be seen with reference to FIG. 11 and FIG. 12, both the telecentricity error and the image contrast vary in dependence of the thickness of the absorber layer or the mask structure 109, a thickness $d_{T,MIN}$ for which the telecentricity error is at a minimum being practically identical to a thickness $d_{C,MAX}$ at which the image contrast is at a maximum. Consequently, both characteristic values relevant to the scanning can be optimised together if the thickness d of the absorber layer is selected in a suitable manner in the region of a maximum $d_{C,MAX}$ or minimum $d_{T,MIN}$. Ideally, the thickness d corresponds to the maximum $d_{C,MAX}$ of the image contrast or the minimum $d_{T,MIN}$ of the telecentricity error; in any case, the distance of the thickness d from an extreme value should be a maximum of 1.5 nm, advantageously a maximum of 0.5 nm.

It will be appreciated that all the above-described steps can be taken together for optimising the imaging of the mask 105, that is to say, both the optical design of the mask structure 109 (the thickness and the lateral profile) and the optical design of the multi-layer coating 108 can be optimised simultaneously, it being desirable also to take into consideration particularly the mutual dependence of the optimisation. It is further possible also to include the illumination distribution in the optimisation, that is to say, for optimising the imaging, it is also possible to consider the mutual influence of the illumination setting(s) and the mask (multi-layer coating and mask structure), that is to say, the illumination settings can be optimised in dependence of the mask structure (source/mask optimisation).

The above description of various embodiments has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

The invention claimed is:

1. A mask for extreme ultraviolet (EUV) lithography comprising:
   a substrate,
   a multi-layer coating applied to the substrate, and
   a mask structure applied to the multi-layer coating and which has an absorber material,
   wherein the mask structure has a maximum thickness of less than 100 nm, and
   wherein the multi-layer coating has an optical design which comprises a positionally-dependent variation of a thickness of a first layer of the multi-layer coating which is dependent on a pitch of the mask structure, and
   wherein the optical design comprises a positionally-dependent variation of a thickness of a second layer of the multi-layer coating that is dependent on the pitch of the mask structure.

2. The mask according to claim 1, wherein the positionally-dependent variation of the optical design of the multi-layer coating comprises a positionally-dependent change in thickness (D(X,Y)) of the multi-layer coating.

3. The mask according to claim 1, wherein an optical design of the mask structure is adapted to the optical design of the multi-layer coating which comprises the positionally-dependent variation of the first layer.

4. The mask according to claim 1, wherein a thickness (d) of the mask structure varies in a positionally-dependent manner in dependence on at least one of: a pitch (p) of the mask structure and an optical design of the multi-layer coating which comprises a positionally-dependent variation.

5. The mask according to claim 1, wherein the mask structure has at least one absorber structure having a structural width (b(Z)) which varies in a thickness direction (Z) of the mask.

6. The mask according to claim 5, wherein at least one flank of the absorber structure has a flank angle ($\alpha_1$, $\alpha_2$) which is different from 90°.

7. The mask according to claim 6, wherein the flank angle ($\alpha_1$, $\alpha_2$) is between 70° and 88° or between 92° and 110°.

8. The mask according to claim 1, wherein the absorber material of the mask structure has an absorption coefficient of more than 0.05.

9. The mask according to claim 8, wherein the absorber material of the mask structure has an absorption coefficient of more than 0.08 at a wavelength of 13.5 nm.

10. The mask according to claim 1, wherein the absorber material is selected from the group consisting of: Pt, Zn, Au, NiO, $Ag_2O$, Ir and Fe.

11. The mask according to claim 1, wherein the absorber material is selected from the group consisting of: $SnO_2$, Co, $Ni_8Cr_2$, SnO and Cu.

12. The mask according to claim 1, wherein the absorber material is selected from the group consisting of: Ag, Ac, Te, CsI and Sn.

13. The mask according to claim 1, wherein the absorber material is selected from the group consisting of: Ni, Ag and ZnTe.

14. The mask according to claim 1, wherein the multi-layer coating comprises a cover layer that is chemically and structurally compatible with the absorber material of the mask structure.

15. An EUV lithography system comprising:
a mask according to claim 1, an illumination system configured and positioned to illuminate the mask with illumination light and an objective lens configured and positioned to image the mask onto a substrate.

16. The EUV lithography system according to claim 15, wherein a thickness (d) of at least one absorber structure of the mask structure deviates by no more than 1.5 nm from a thickness ($d_{C,MAX}$, $d_{T,MIN}$) at which at least one imaging characteristic value of the EUV lithography system has a minimum ($d_{T,MIN}$) or a maximum ($d_{C,MAX}$).

17. The EUV lithography system according to claim 16, which is configured to operate the mask at a chief ray angle of at least 5°.

18. The EUV lithography system according to claim 15, wherein at least one absorber structure of the mask structure has a structural width (b(Z)) which varies in a thickness direction (Z) of the mask and which improves at least one imaging characteristic value of the EUV lithography system a relative to an absorber structure having a structural width (b) which is constant in the thickness direction (Z).

19. The EUV lithography system according to claim 15, wherein the multi-layer coating has an optical design which comprises a positionally-dependent variation and which improves at least one imaging characteristic value of the EUV lithography system relative to a multi-layer coating having an optical design which is not dependent on position.

20. The EUV lithography system according to claim 15, wherein the multi-layer coating has an optical design which comprises a positionally-dependent variation which is dependent on the mask structure, and
wherein an optical design of the mask structure is adapted to the optical design of the multi-layer coating which comprises the positionally-dependent variation.

21. The EUV lithography system according to claim 15, wherein the multi-layer coating has, in at least a part-region of the mask, a thickness at which at least one imaging characteristic value of the EUV lithography system is improved relative to a further multi-layer coating having a thickness at which the reflectivity (R) of the further multi-layer coating is optimised for the incidence angle range of the EUV lithography system.

22. The EUV lithography system according to claim 15, which has, during the imaging of the mask, a telecentricity error between −0.5 mrad and 0.5 mrad.

23. The EUV lithography system according to claim 15, wherein the objective lens has a numerical aperture of 0.2 or more.

24. The EUV lithography system according to claim 15, wherein the imaging characteristic value is a telecentricity error or an image contrast.

25. The EUV lithography system according to claim 15, which has, during the imaging of the mask, a telecentricity error between −0.1 mrad and 0.1 mrad.

26. The EUV lithography system according to claim 15, wherein the objective lens has a numerical aperture of 0.5 or more.

27. The EUV lithography system according to claim 15, wherein the pitch of the mask structure comprises a variation in the pitch.

28. The mask according to claim 1, wherein the maximum thickness of the multi-layer coating is no more than 10 nm.

29. The mask according to claim 1, wherein the positionally-dependent variation of the thickness of the first layer varies between a first thickness and a second thickness, and wherein the first thickness is greater than zero and the second thickness is greater than zero.

30. The mask according to claim 1, wherein the pitch of the mask structure comprises a variation in the pitch.

* * * * *

UNITED STATES PATENT AND TRADEMARK OFFICE
CERTIFICATE OF CORRECTION

PATENT NO. : 9,535,332 B2  
APPLICATION NO. : 13/714648  
DATED : January 3, 2017  
INVENTOR(S) : Peter B. Kim Page 1 of 1

It is certified that error appears in the above-identified patent and that said Letters Patent is hereby corrected as shown below:

In the Specification

Column 2, Line 7, Delete "$Pitch_{min} \sim \lambda(NA(1+\sigma))$" and insert -- $Pitch_{min} \sim \lambda / (NA (1+\sigma))$ --, therefor.

Column 16, Line 43, Delete "multilayer" and insert -- multi-layer --, therefor.

Signed and Sealed this  
Third Day of November, 2020

Andrei Iancu  
*Director of the United States Patent and Trademark Office*